(12) United States Patent
Zhou

(10) Patent No.: US 11,728,400 B2
(45) Date of Patent: Aug. 15, 2023

(54) SEMICONDUCTOR STRUCTURE

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

(*) Notice: Subject to any disclaimer, the term of this patent is extended or adjusted under 35 U.S.C. 154(b) by 179 days.

(21) Appl. No.: 17/007,579

(22) Filed: Aug. 31, 2020

(65) Prior Publication Data

US 2020/0395457 A1    Dec. 17, 2020

Related U.S. Application Data

(62) Division of application No. 16/105,670, filed on Aug. 20, 2018, now Pat. No. 10,797,147.

(30) Foreign Application Priority Data

Aug. 22, 2017  (CN) .......................... 201710727131.3

(51) Int. Cl.
| | | |
|---|---|---|
| *H01L 27/092* | (2006.01) | |
| *H01L 29/423* | (2006.01) | |
| *H01L 29/786* | (2006.01) | |
| *H01L 29/66* | (2006.01) | |
| *H01L 21/311* | (2006.01) | |
| *H01L 21/3065* | (2006.01) | |
| *H01L 21/308* | (2006.01) | |
| *H01L 21/306* | (2006.01) | |
| *H01L 21/8238* | (2006.01) | |

(Continued)

(52) U.S. Cl.
CPC ...... *H01L 29/42392* (2013.01); *H01L 21/308* (2013.01); *H01L 21/3065* (2013.01); *H01L 21/30604* (2013.01); *H01L 21/31116* (2013.01); *H01L 21/31144* (2013.01); *H01L 21/8221* (2013.01); *H01L 21/823878* (2013.01); *H01L 21/84* (2013.01); *H01L 27/0688* (2013.01); *H01L 29/66545* (2013.01); *H01L 29/66742* (2013.01); *H01L 29/7848* (2013.01); *H01L 29/78603* (2013.01); *H01L 29/78696* (2013.01); *H01L 29/165* (2013.01)

(58) Field of Classification Search
None
See application file for complete search history.

(56) References Cited

U.S. PATENT DOCUMENTS 9,362,355 B1   6/2016   Cheng et al.
9,653,289 B1   5/2017   Balakrishnan et al.
(Continued)

*Primary Examiner* — Bilkis Jahan
(74) *Attorney, Agent, or Firm* — Anova Law Group, PLLC

(57) ABSTRACT

Semiconductor structures is provided. The semiconductor structure includes a semiconductor substrate, a plurality of fins protruding from the semiconductor substrate, an isolation layer formed on the fins and with a bandgap greater than a bandgap of the fins, and a first channel layer formed on the isolation layer and isolated from the isolation layer.

9 Claims, 5 Drawing Sheets

(51) Int. Cl.
*H01L 27/06* (2006.01)
*H01L 21/84* (2006.01)
*H01L 29/78* (2006.01)
*H01L 21/822* (2006.01)
*H01L 29/165* (2006.01)

(56) References Cited

U.S. PATENT DOCUMENTS

| | | |
|---|---|---|
| 9,660,033 B1 | 5/2017 | Chen et al. |
| 9,972,542 B1 * | 5/2018 | Bi .................... H01L 29/42392 |
| 2014/0001441 A1 | 1/2014 | Kim et al. |
| 2014/0001502 A1 | 1/2014 | Akimoto et al. |
| 2015/0340457 A1 | 11/2015 | Xie et al. |
| 2015/0340490 A1 | 11/2015 | An et al. |
| 2015/0372104 A1 | 12/2015 | Liu et al. |
| 2016/0126340 A1 | 5/2016 | Nechay et al. |
| 2017/0005195 A1 | 1/2017 | Ching et al. |
| 2017/0110554 A1 * | 4/2017 | Tak .................. H01L 29/66439 |
| 2017/0170270 A1 * | 6/2017 | Chu ...................... H01L 29/775 |
| 2017/0179248 A1 * | 6/2017 | Pawlak ............. H01L 29/66439 |
| 2017/0186846 A1 | 6/2017 | Badaroglu et al. |
| 2018/0277628 A1 * | 9/2018 | Bi ......................... H01L 25/072 |
| 2018/0308699 A1 | 10/2018 | Yeung et al. |
| 2019/0067122 A1 * | 2/2019 | Cheng ............ H01L 21/823807 |

\* cited by examiner

SEMICONDUCTOR STRUCTURE

CROSS-REFERENCES TO RELATED APPLICATIONS

This application is a divisional of U.S. patent application Ser. No. 16/105,670, filed on Aug. 20, 2018, which claims the priority of Chinese patent application No. 201710727131.3, filed on Aug. 22, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods.

BACKGROUND

With the repaid development of semiconductor manufacturing technologies, semiconductor devices have been developed towards higher device density and higher integration level. As basic semiconductor devices, transistors have been widely used. With the continuous increase of the device density and integration level, the channel length of the transistor has been continuously reduced. With the continuous reduction of the channel length of the transistor, the distance between the source and the drain of the transistor has been continuously reduced. Thus, the control ability of the gate of the transistor to the channel of the transistor has become weaker and weaker. Correspondingly, the sub-threshold leakage, i.e., the short-channel effects (SCEs), is easy to occur; and the leakage current of the channel of the transistor is increased.

Thus, to better adapt the requirements for the miniaturization of semiconductor devices, semiconductor technologies have been gradually transferred from planar transistors to three-dimensional (3D) transistors which have better performance. Gate-all-around (GAA) transistors is one of the typical 3D transistors. In a GAA transistor, the gate surrounds all around the region having the channel. Comparing with a planar transistor, the control ability of the gate of the GAA transistor on the channel is increased; and the SCEs of the transistor are better suppressed.

On the other hand, to increase the carrier mobility of the channel of the transistor, a stress layer is introduced to form the source region and the drain region of the transistor. By using the crystal lattice mismatch between the stress layer material and the channel material, the stress layer is able to apply a compressive stress or a tensile stress to the channel region of the transistor; and the performance of the transistor is improved.

However, when the GAA structure is introduced into the transistor having the stress layer, the stress layer may be easily damaged. Accordingly, the performance of the semiconductor structure may be degraded. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate having a fin material layer on the semiconductor substrate; forming an isolation material layer on the fin material layer and having a bandgap greater than a bandgap of the fin material layer; forming a stacked channel material layer on the isolation material layer, wherein the stacked channel material layer includes a sacrificial material layer and a channel material layer on the sacrificial material layer; and etching the stacked channel material layer, the isolation material layer and the fin material layer to form fins protruding from the semiconductor substrate, an isolation layer on the fins and a stacked channel layer on the isolation layer, wherein the stacked channel layer includes a sacrificial layer on the isolation layer and a channel layer on the sacrificial layer.

Another aspect of the present disclosure includes a semiconductor structure. The semiconductor structure includes a semiconductor substrate; a plurality of fins protruding from the semiconductor substrate; an isolation layer formed the fins and with a bandgap greater than a bandgap of the fins; and a channel layer formed on the isolation layer and alternatively disposed with the isolation layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
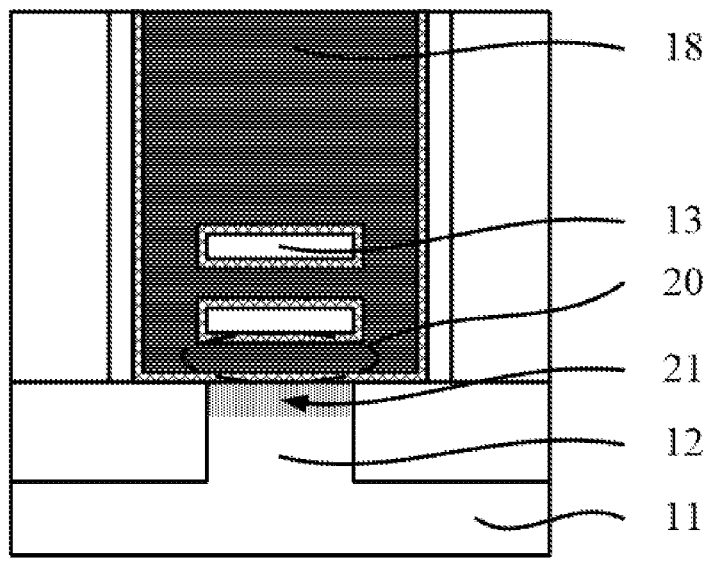
FIG. 1 illustrates a gate-all-around semiconductor structure.

FIG. 1 illustrates a gate-all-around (GAA) semiconductor structure. As shown in FIG. 1, the GAA semiconductor structure includes a semiconductor substrate 11, a fin 12 protruding from a surface of the semiconductor substrate 11, a channel layer 13 formed on the fin 12 and isolated from the fin 12, and an all-around gate 18 formed on the fin 12 and surrounding the channel layer 13.

Because the all-around gate 18 surrounds the channel layer 13, the all-around gate 18 fills the gap (i.e., the structure circled as 20 in FIG. 1) between the channel layer 13 and the fin 12. When the all-around gate 18 receives a signal to turn on the channel of the semiconductor structure, a channel is formed in the channel layer 13, and a parasitic channel 21 is also formed in the top portion of the fin 12 due to the control of the all-around gate 18. The parasitic channel would increase the leakage current of the semiconductor structure; and the performance of the semiconductor structure may be affected.

The present disclosure provides a semiconductor structure and a method for forming the semiconductor structure. In the disclosed method for forming the semiconductor structure, an isolation layer may be formed between the stacked channel layer and the fins. The subsequently formed all-around gate structure may be disposed on the isolation layer. Thus, the possibility for forming the parasitic channel in the fins under the all-around gate structure may be reduced. Accordingly, the formation of the leakage current in the semiconductor structure may be effectively suppressed; and the performance of the semiconductor structure may be improved.

Figure 8:
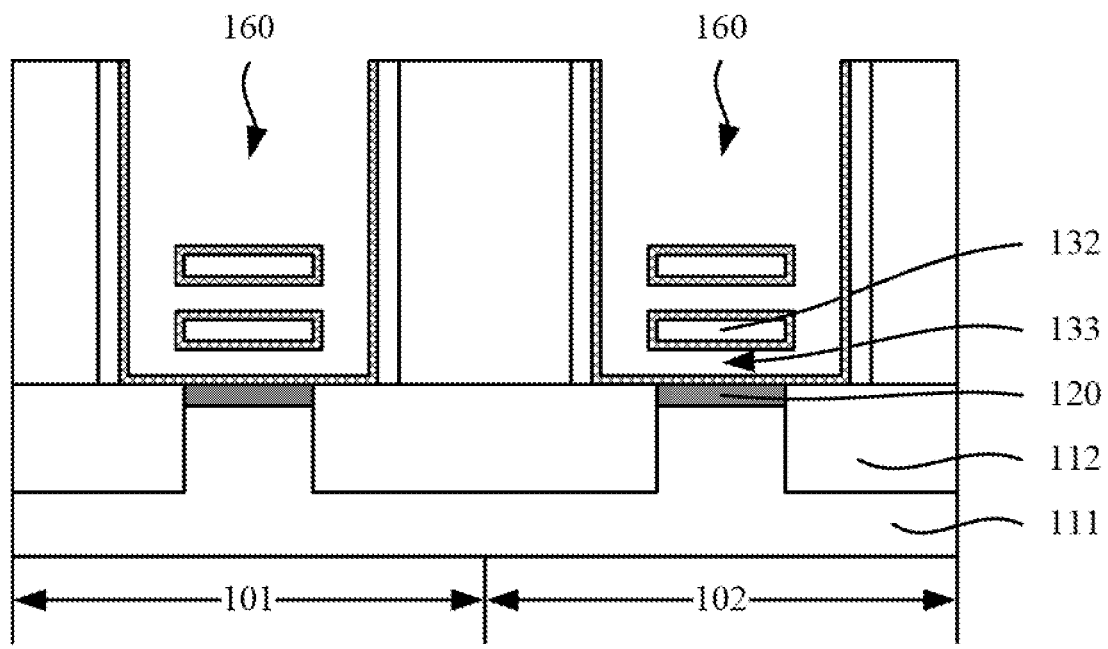
Figure 9:
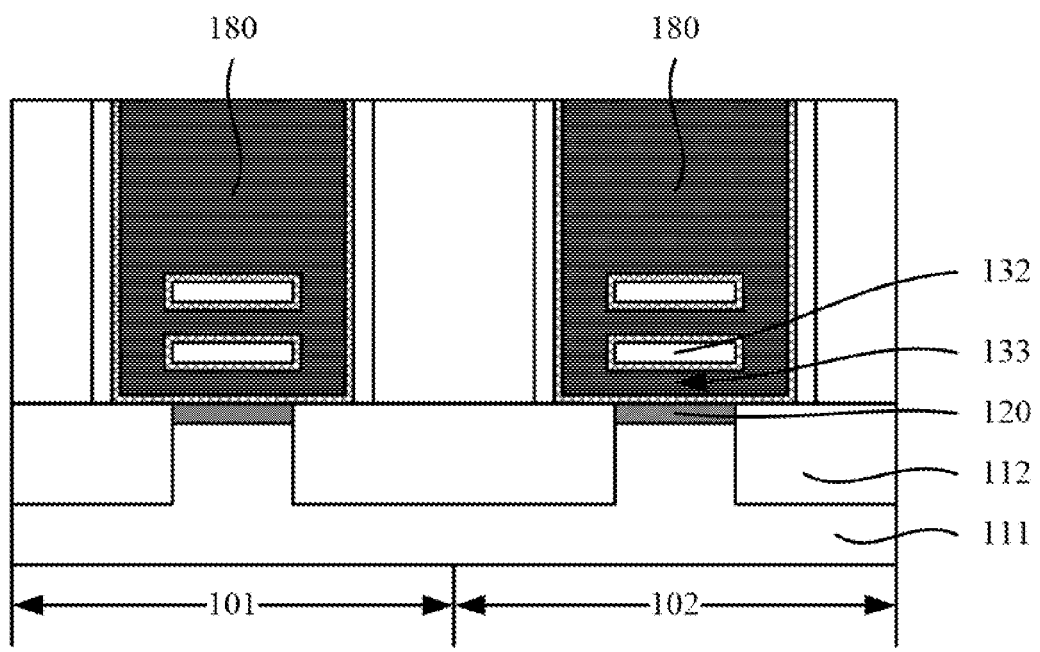
Figure 10:
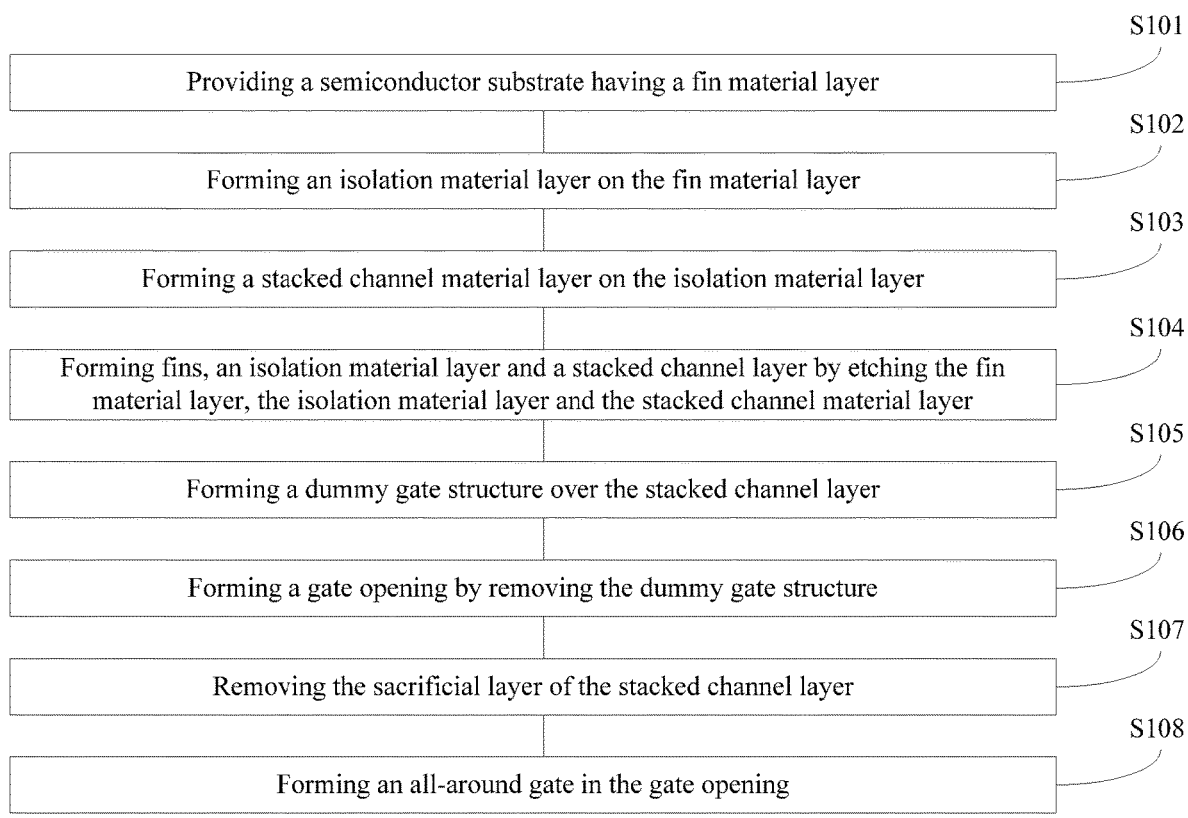
FIG. 10 illustrates an exemplary fabrication process of a semiconductor structure consistent with various disclosed embodiments.

FIG. 10 illustrates an exemplary fabrication process of a semiconductor structure consistent with various disclosed embodiments. FIGS. 2-9 illustrate structures corresponding to certain stages during the exemplary fabrication process.

Figure 2:
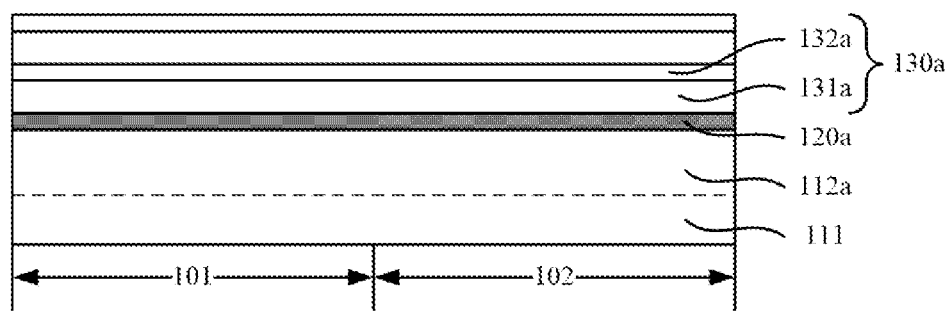
FIGS. 2-9 illustrate structures corresponding to certain stages during an exemplary fabrication process of a semiconductor structure consistent with various disclosed embodiments.

As shown in FIG. 10, at the beginning of the fabrication process, a semiconductor substrate with certain structures is provided (S101). FIG. 2 illustrates a corresponding semiconductor structure.

As shown in FIG. 2, a semiconductor substrate 111 is provided. A fin material layer 112a may be formed over the semiconductor substrate 111. The semiconductor substrate 111 provides a process platform for subsequent processes.

In one embodiment, the semiconductor structure is a CMOS device, the semiconductor substrate 111 may include a PMOS region 101 for forming a PMOS device and an NMOS region for forming an NMOS device. In some embodiments, the semiconductor structure may be only a PMOS device or an NMOS device. Accordingly, the semiconductor substrate may only include a PMOS region or an NMOS region.

In one embodiment, the semiconductor substrate 111 in the PMOS region 101 is adjacent to the semiconductor substrate 111 in the NMOS region 102. In some embodiments, the semiconductor substrate in the PMOS region and the semiconductor substrate in the NMOS region may be isolated by other structure(s).

In one embodiment, the semiconductor substrate 111 is made of single crystal silicon. In some embodiments, the semiconductor substrate may be made of polysilicon, amorphous silicon, amorphous germanium, germanium, silicon germanium, silicon carbide, gallium arsenide, or gallium indium, etc. In some other embodiments, the semiconductor substrate may be a silicon on insulator (SOI) substrate, a germanium on insulator (GOI) substrate, or a glass substrate, etc. The material of the semiconductor substrate may be a material that meets the process requirements and is easy to be integrated.

The fin material layer 112a may provide a process base for subsequently forming fins. The fin material layer 112a may be used to form fins by an etching process.

In one embodiment, the fin material layer 112a and the semiconductor substrate 111 are made of a same material, e.g., single crystal silicon. In some embodiments, the fin material layer and the semiconductor substrate may be made of different materials. The fin material layer 112a may be made of other appropriate semiconductor material, such as silicon, germanium, silicon germanium, or silicon carbide, etc.

In one embodiment, the fin material layer 112a and the semiconductor substrate 111 may be an integrated structure. That is, the semiconductor substrate 111 and the fin material layer 112a may be different portions of a base substrate. In some embodiments, the fin material layer may be a semiconductor layer formed on the semiconductor substrate so as to precisely control the thickness of the fin material layer and thus precisely control the height of the subsequently formed fins.

Returning to FIG. 10, after forming the fin material layer, an isolation material layer may be formed (S102). FIG. 2 illustrates a corresponding semiconductor structure.

As shown in FIG. 2, an isolation material layer 120a is formed on the fin material layer 112a. The bandgap of the material of the isolation material layer 120 may be greater than the bandgap of the material of the fin material layer 112a.

The isolation material layer 120a may be used to subsequently form an isolation layer. The isolation layer may be used to isolation a subsequently formed fins from a subsequently formed all-around gate structure to increase the distance between the fins and the all-around gate structure. Accordingly, a parasitic channel may be prevented from being formed the fins under the function of the all-around gate structure; and the leakage current of the semiconductor structure may be suppressed.

Because the bandgap of the material of the isolation material layer 120a may be greater than the bandgap of the material of the fin material layer 112a, that is, the energy difference between the Fermi level and the bottom of the conduction band of the material of the isolation material layer 120a may be smaller than the energy difference between the Fermi level and the bottom of the conduction band of the material of the fin material layer 112a, the turn-on voltage of the channel in the isolation material layer 120a may be substantially high. Thus, the formation of a parasitic channel in the subsequently formed fin under the effect of a subsequently formed all-around gate structure may be effectively reduced. Accordingly, the leakage current in the semiconductor structure may be suppressed; and the performance of the semiconductor structure may be improved.

In one embodiment, the fin material layer 112a is made of silicon (Si), the bandgap of the material of the isolation material layer 120a may be greater than the bandgap of Si. For example, the bandgap of Si may approximately 1.12 eV, the bandgap of the material of the isolation material layer 120a may be greater than 1.12 eV.

In one embodiment, the isolation material layer 120a is made of at least one of GaN and AlGaN which has a substantially wide bandgap. Thus, the channel region in the isolation material layer 120a may have a substantially large turn-on voltage. Accordingly, the isolation between the subsequently formed fins and the all-around gate structure may be achieved; the formation of the parasitic channel may be effectively prevented; and the leakage current of the semiconductor structure may be suppressed.

The thickness of the isolation material layer 120a may be any appropriate value. In one embodiment, the thickness of the isolation material layer 120a may be in a range of approximately 20 Å-400 Å. When the thickness of the isolation material layer 120a is too small, it may be difficult to form the isolation between the subsequently formed fins and the subsequently formed all-around gate. The distance between the subsequently formed fins and the subsequently formed all-around gate may be substantially small; and the formation of the parasitic channel in the fins may not be sufficiently suppressed. When the thickness of the isolation layer 120a is too large, it may cause a waste of material; and the process difficulty may be increased.

The isolation material layer 120a may be formed by any appropriate process. In one embodiment, the isolation material layer 120a may be formed by an epitaxial growth process. The quality of the material formed by the epitaxial growth process may be sufficiently high. Thus, the quality of the isolation material layer 120a may be improved; and the quality of the isolation layer may be improved. Further, when the quality of the isolation material layer 120a is improved, the surface quality of the isolation material layer 120a may also be improved; and a sufficiently good growth interface may be provided for subsequent layers. Accordingly, the quality of the stacked channel layer may be improved; and the performance of the semiconductor structure may be improved.

The parameters of the epitaxial growth process for forming the isolation material layer 120a may be dependent of the thickness of the isolation material layer 120a. The parameters may be properly selected according to thickness of the isolation material layer 120a and the material of the isolation material layer 120a to obtain the isolation material layer 120a with a desired quality.

Referring to FIG. 2, after forming the isolation material layer 120a, a stacked channel material layer 130a may be formed on the isolation material layer 120a (S103). The stacked channel material layer 130a may include a sacrificial material layer 131a on the isolation material layer 120a and a channel material layer 132a on the sacrificial material layer 131a.

The stacked channel material layer 130a may be used to subsequently form a stacked channel layer. The sacrificial material layer 131a may be used to subsequently form a sacrificial layer. The channel material layer 132a may be used to subsequently form a channel layer.

In one embodiment, referring to FIG. 2, two stacked channel material layers 130a may be formed over the semiconductor substrate 111. That is, two sacrificial material layers 131a and two channel material layers 132a may be alternately formed on the isolation material layer 120a.

To allow the subsequently formed isolation layer to have a sufficient isolation effect to prevent turning on the parasitic channel, in one embodiment, the bandgap of the material of the isolation material layer 120a is greater than the bandgap of the material of the channel material layer 132a. That is, the bandgap of the material of the channel material layer 132a may be smaller than the bandgap of the material of the isolation material layer 120a such that the turn-on voltage of the channel in the subsequently formed channel layer may be smaller than the turn-on voltage of the channel in the subsequently formed isolation layer.

In one embodiment, the channel material layer 132a is made of Si, the sacrificial material layer 131a may be made of SiGe. Si and Ge may have a substantially high etching selectivity during subsequently removing the sacrificial layer. Thus, selecting Si as the material of the channel material layer and SiGe as the material of the sacrificial layer 131 may effectively reduce the damage of the subsequent etching process on the channel layer when removing the sacrificial layer. Accordingly, the quality of the channel layer may be improved; and the performance of the semiconductor structure may be improved as well.

The thickness of the channel material layer 132a may be any appropriate value. In one embodiment, the thickness of the channel material layer 132a may be in a range of approximately 40 Å-200 Å. When the thickness of the channel material layer 132a is too small, the thickness of the subsequently formed channel layer may be too small. Thus, the channel width of the semiconductor structure may be too small; and the semiconductor structure may have certain electrical issues. For example, the on-resistance of the semiconductor structure may be substantially large. When the thickness of the channel material layer 132a is too large, it may cause a waste of material; and the process difficulty may be increased.

The thickness of the sacrificial material layer 131a may be any appropriate value. In one embodiment, the thickness of the sacrificial material layer 131a may be in a range of approximately 50 Å-600 Å. When the thickness of the sacrificial material layer 131a is too small, the distance between subsequently formed adjacent channel layers may be too small; and the performance of the semiconductor structure may be adversely affected. When the thickness of the sacrificial material layer 131a is too large, it may cause a waste of material; and the process difficulty may be increased.

In one embodiment, the stacked channel material layer 130a may be formed by an epitaxial growth process. That is, the sacrificial layer 131a and the channel material layer 132a may be formed by the epitaxial growth process. Forming the stacked channel layer 130a by the epitaxial growth process may be able to effectively improve the quality of the stacked channel material layer 130a; and the quality of the subsequently formed stacked channel layer may be improved; and the performance of the semiconductor structure may be improved.

The parameters of the epitaxial growth process for forming the stacked channel material layer 130a may be dependent of the parameters of the epitaxial growth process for forming the sacrificial material layer 131a and the channel material layer 132a. By properly setting up the parameters of the epitaxial growth process according to certain parameters of the sacrificial material layer 120a and the channel material layer 132a, the stacked channel material layer 130a with a substantially high quality may be obtained.

Figure 3:
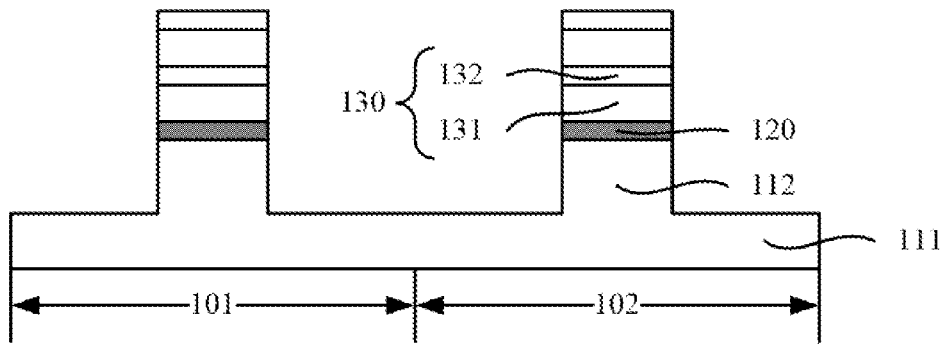

Returning to FIG. 10, after forming the stacked channel material layer, at least one fin, an isolation layer and a sacrificial layer may be formed (S104). FIG. 3 illustrates a corresponding semiconductor structure.

As shown in FIG. 3, at least one fin 112 protruding from the semiconductor substrate 111 may be formed on the semiconductor substrate 111. In one embodiment, the semiconductor substrate 111 may include a PMOS region 101 and an NMOS region 102. One fin 112 may be formed on the semiconductor substrate 111 in the PMOS region 101; and one fin 112 may be formed on the semiconductor substrate 111 in the NMOS region 102. In some embodiments, a plurality of fins may be formed on the semiconductor substrate.

Further, an isolation layer 120 may be formed on the fin 112 and a stacked channel layer 130 may be formed on the isolation layer 120. The stacked channel layer 130 may include a sacrificial layer 131 on the isolation layer 120 and a channel layer 132 on the sacrificial layer 131.

Referring to FIG. 3, the fin 112, the isolation layer 120 and the stacked channel layer 130 may be formed by etching the stacked channel material layer 130a, the isolation material layer 120a and the fin material layer 112a.

Various processes may be used to etch the stacked channel material layer 130a, the isolation material layer 120a and the fin material layer 112a. In one embodiment, a dry etching process may be used to etch the stacked channel material layer 130a, the isolation material layer 120a and the fin material layer 112a to form the fin 112, the isolation layer 120 and the stacked channel layer 130. In particular, a fin mask layer (not shown) may be formed on the stacked channel material layer 130a. Then, the dry etching process may be used to sequentially removing a portion of the stacked channel material layer 130a, a portion of the isolation material layer 120a and a portion of the fin material layer 112a using the fin mask layer as an etching mask.

In one embodiment, the fin material layer 112a is made of single crystalline silicon. Thus, the fin 112 may also be made of single crystalline silicon. Further, the fin material layer 112a and the semiconductor substrate 111 may be an integrated structure; the fin 112 may protrude from the surface of the semiconductor substrate 111; and the fin 112 and the semiconductor substrate 111 may also be an integrated structure. That is, the fin 112 and the semiconductor substrate 111 may have no obvious interface.

In some embodiments, the fin material layer and the semiconductor substrate may be made of different materials. Thus, the fin and the semiconductor substrate may be made of different materials.

Further, the height of the fin 112 may be approximately equal to the thickness of the fin material layer 112*a*. Thus, the height of the fin 112 may be controlled by controlling the thickness of the fin material layer 112*a*.

The isolation layer 120 may be used to isolate the fin from the subsequently formed all-around gate structure; and to increase the distance between the fin 112 and the all-around gate structure so as to reduce the possibility for forming a parasitic channel in the fin 112 under the control of the all-around gate structure. Accordingly, the leakage current of the semiconductor structure may be suppressed.

Because the bandgap of the material of the isolation material layer 120*a* may be greater than the bandgap of the material of the fin material layer 112*a*, that is, the bandgap of the material of the isolation layer 120 may be greater than the bandgap of the material of the fin 112, the energy difference between the Fermi level of the material of the isolation layer 120 and the bottom of the conduction band of the isolation layer 120 is substantially large; and the required turn-on voltage for forming a channel in the isolation layer 120 may be substantially large. Therefore, under the control of a same constant gate voltage, the possibility for turning on the channel in the isolation layer 120 may be substantially small. Accordingly, forming the isolation layer 120 may be able to achieve an isolation between the fin 112 and the subsequently formed all-around gate structure; and the possibility for forming a parasitic channel may be significantly reduced. Thus, the leakage current of the semiconductor structure may be reduced; and the performance of the semiconductor structure may be improved.

In one embodiment, the fin 112 is made of Si, the bandgap of the material of the isolation material layer 120*a* may be greater than the bandgap of Si. Thus, the bandgap of the material of the isolation layer 120 may also be greater than the bandgap of Si. In particular, the bandgap of the material of the isolation layer 120 may be greater than 1.12 eV.

In one embodiment, the isolation material layer 120*a* is made of at least one of GaN and AlGaN. Thus, the isolation layer 120 may also be made of at least one of GaN and AlGaN. Further, the thickness of the isolation material layer 120*a* may be in a range of approximately 20 Å-400 Å. Thus, the thickness of the isolation layer 120 may also be in a range of approximately 20 Å-400 Å.

In one embodiment, because the isolation material layer 120*a* may be formed by an epitaxial growth process, the quality of the isolation material layer 120*a* may be as desired. Accordingly, the quality of the isolation layer 120 may be also be as desired; and the performance of the semiconductor structure may be improved.

The stacked channel layer 130 may provide a process base for subsequently forming the suspended channel layer 132. In particular, the sacrificial layer 131 may support the channel layer 132; and may provide a process base for suspending the channel layer 132; and also occupy a spatial position for subsequently forming an all-around gate structure. The channel of the semiconductor structure may be in the channel layer 132.

In one embodiment, as shown in FIG. 3, two stacked channel material layers 130*a* may be formed on the semiconductor substrate 111. That is, two sacrificial layers 131 and two channel layers 132 are alternately formed on the isolation layer 120.

In one embodiment, the bandgap of the material of the isolation material layer 120*a* may be greater than the bandgap of the material of the channel material layer 132*a*. Thus, the bandgap of the material of the isolation layer 120 may be greater than the bandgap of the material of the channel layer 132. Accordingly, the isolation function of the isolation layer 120 may be ensured; and the channel in the isolation layer 120 may be prevented from turning on.

In one embodiment, the channel material layer 132*a* is made of Si; and the sacrificial material layer 131*a* is made of SiGe. Thus, the channel layer 132 may be made of Si; and the sacrificial layer 131 may be made of SiGe. In particular, the thickness of the channel material layer 132*a* may be in range of approximately 40 Å-200 Å; and the thickness of the sacrificial material layer 131*a* may be in range of approximately 50 Å-600 Å. Thus, the thickness of the channel layer 132 may be in range of approximately 40 Å-200 Å; and the thickness of the sacrificial layer 131 may be in range of approximately 50 Å-600 Å.

In one embodiment, because the channel material layer 132*a* may be formed by an epitaxial growth process, the quality of the channel material layer 132*a* may be as desired. Accordingly, the quality of the channel layer 132 may be also be as desired. That is, the channel of the semiconductor structure may be located in the channel layer 132 with the desired quality. Thus, the performance of the semiconductor structure may be improved.

Figure 4:
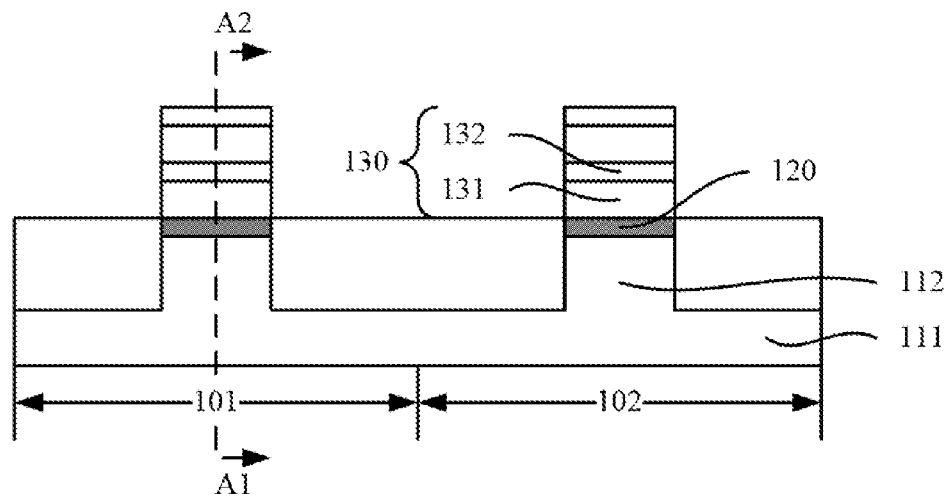
Figure 5:
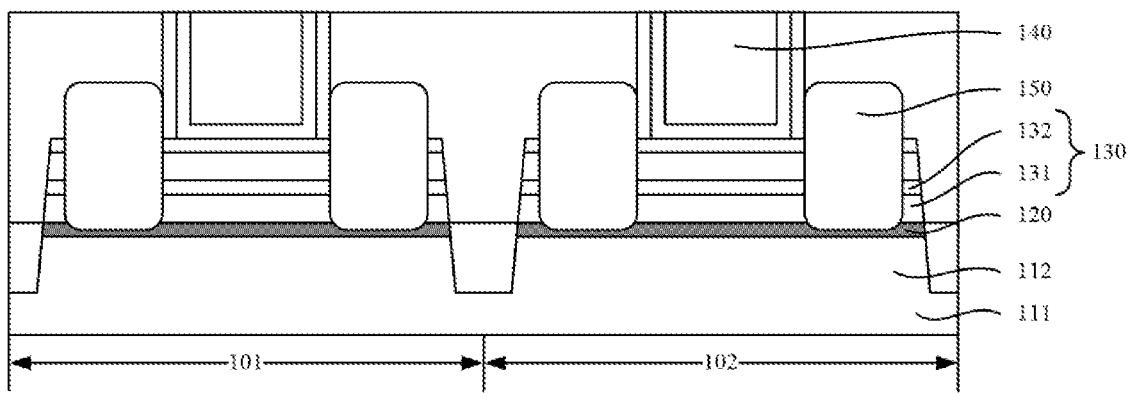

Returning to FIG. 10, after forming the stacked channel layer, a dummy gate structure may be formed (S105). FIGS. 4-5 illustrate a corresponding semiconductor structure. FIG. 5 is an A1A2-sectional view of the semiconductor structure in FIG. 4.

Figure 4A:
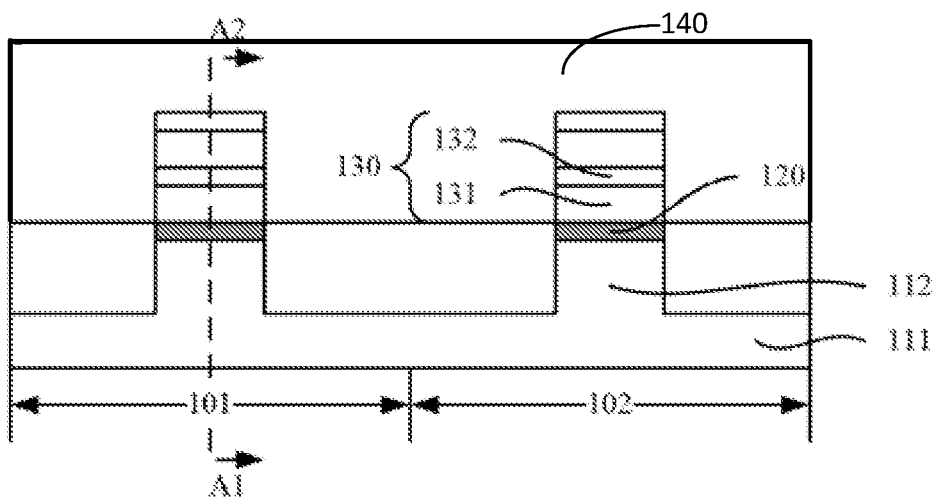

As shown in FIGS. 4-5, a dummy gate structure 140 may be formed over the stacked channel layer 130. The dummy gate structure 140 may be at least across the stacked channel layer 130 by covering a portion of the top surface of the stacked channel layer 130 and portions of sidewall surfaces of the stacked channel layer 130 as shown in FIG. 4A and FIG. 5.

The dummy gate structure 140 may provide a spatial space for subsequently forming an all-around gate structure. In one embodiment, the dummy gate structure 140 may be across the fin 112, the isolation layer 120 and the stacked channel layer 130. Further, the dummy gate structure 140 may cover a portion of the top surface of the stacked channel layer 130 and portions of the sidewall surfaces of the stacked channel layer 130.

In one embodiment, the dummy gate structure 140 may be a multiple-layer stacked structure. The dummy gate structure 140 may include a dummy oxide layer (not shown) and a dummy gate layer (not shown) on the dummy gate oxide layer.

In one embodiment, the dummy oxide layer may be made of silicon oxide; and the dummy gate layer may be made of polysilicon. In some embodiments, the dummy oxide layer may be made of silicon oxynitride; and the dummy gate layer may be made of silicon oxide, silico nitride, silicon oxynitride, silicon carbide, silicon carbonitride, silicon oxycarbonitride, or amorphous carbon, etc.

In some embodiments, the dummy gate structure may be a single-layer structure. Correspondingly, the dummy gate structure may only include a dummy gate layer.

The process for forming the dummy gate structure 140 may include forming a dummy oxide material layer on the stacked channel layer 130; forming a dummy gate material layer on the dummy oxide material layer; forming a gate mask layer on the dummy gate material layer; and etching the dummy oxide material layer and the dummy gate material layer using the mask layer as an etching mask. Thus, the dummy gate structure 140 may be formed.

Further, after forming the dummy gate structure 140, sidewall spacers (not shown) may be formed on the sidewall surfaces of the dummy gate structure 140 to protect the dummy gate structure 140 and define the positions of the subsequently formed source and drain of the semiconductor structure. The sidewall spacers may be made of silicon oxide, silicon nitride, silicon oxynitride, silicon carbide, silicon carbonitride, silicon oxycarbonitride, or boron nitride, etc. The sidewall spacers may be a single layer structure, or a multiple-layer stacked structure. In one embodiment, the sidewall spacers are single layer structures made of silicon nitride.

Further, as shown in FIG. 4, in one embodiment, after forming the fin 112, the isolation layer 120 and the channel layer 130 and before forming the dummy gate structure 140, an isolation structure (not labeled) may be formed on the semiconductor substrate 111 between adjacent fins 112. The isolation structure may at least expose the sidewall surfaces of the stacked channel layer 130. The isolation structure may be used to electrically isolate adjacent fins 112 and electrically isolate adjacent semiconductor structures.

In one embodiment, the isolation structure is made of silicon oxide. In some embodiments, the isolation structure may be made of silicon nitride, or silicon oxynitride, etc.

In one embodiment, the process for forming the isolation structure may include forming a dielectric material layer on the portions of the semiconductor substrate 111 exposed by the fins 112. The dielectric material layer may cover the fins 112, the isolation layer 120 and the stacked channel layer 130. Then, an etch-back process may be performed to remove a partial thickness of the dielectric material layer to the form the isolation structure. The isolation structure may at least expose the sidewall surfaces of the stacked channel layer 130.

In one embodiment, the top surface of the isolation structure may level with the top surface of the isolation layer 120. That is, the isolation structure may expose portions of the sidewall surfaces of the stacked channel layer 130. In some embodiments, the top surface of the isolation structure may be below the top surface of the isolation layer, or may be below the top surface of the fin. Thus, the isolation structure may expose portions of the sidewall surfaces of the stacked channel layer and portions of the sidewall surfaces of the isolation layer. Further, the isolation structure may also expose portions of the sidewall surfaces of the fin.

Further, as shown in FIG. 5, after forming the dummy gate structure 140, doped source/drain regions (not labeled) may be formed in the stacked channel layer 130 at both sides of the dummy gate structure 140; and an interlayer dielectric layer (not labeled) may be formed on the semiconductor substrate 111 between adjacent dummy gate structures 140.

The doped source/drain regions may be used to form the doped source/drain regions of the semiconductor structure.

In one embodiment, the doped source/drain regions may include a stress layer 150; the semiconductor structure is a CMOS device; and the semiconductor substrate 111 may include the PMOS region 101 and the NMOS region 102. Thus, the doped source/drain regions in the stacked channel layer 130 on the semiconductor substrate 111 the PMOS region 101 may be P-type doped source/drain regions. That is, the stress layer 150 in the PMOS region 101 may be made of SiGe or Si; and the doping ions doped in the stress layer 150 may be p-type ions, such as B ions, Ga ions, or In ions, etc. The doped source/drain regions in the stacked channel layer 130 on the semiconductor substrate 111 in the NMOS region 102 may be N-type doped source/drain regions. That is, the stress layer 150 in the NMOS region 102 may be made of SiC or Si; and the doping ions doped in the stress layer 150 may be N-type ions, such as P ions, As ions, or Sb ions, etc.

The process for forming the doped source/drain region may include forming trenches in the stacked channel layer 130 at both sides of the dummy gate structure 140; filling a stress material in the trenches to form the stress layer 150; and doping the stress layer 150 to form the doped source/drain regions.

In one embodiment, the semiconductor structure may have an all-around gate structure. Thus, during forming the trenches, the bottoms of the trenches may expose the isolation layer 120. Accordingly, the stress layer 150 may at least contact with the isolation layer 120.

The interlayer dielectric layer may be used to electrically isolate adjacent semiconductor structures. Further, the interlayer dielectric layer may also define the size and the position of the subsequently formed all-around gate structure.

In one embodiment, the interlayer dielectric layer is made of silicon oxide. In some embodiments, the interlayer dielectric layer may be made of other dielectric material, such as silicon nitride, or silicon oxynitride, etc. The details for forming the interlayer dielectric layer may be referred to the existing technologies.

Figure 6:
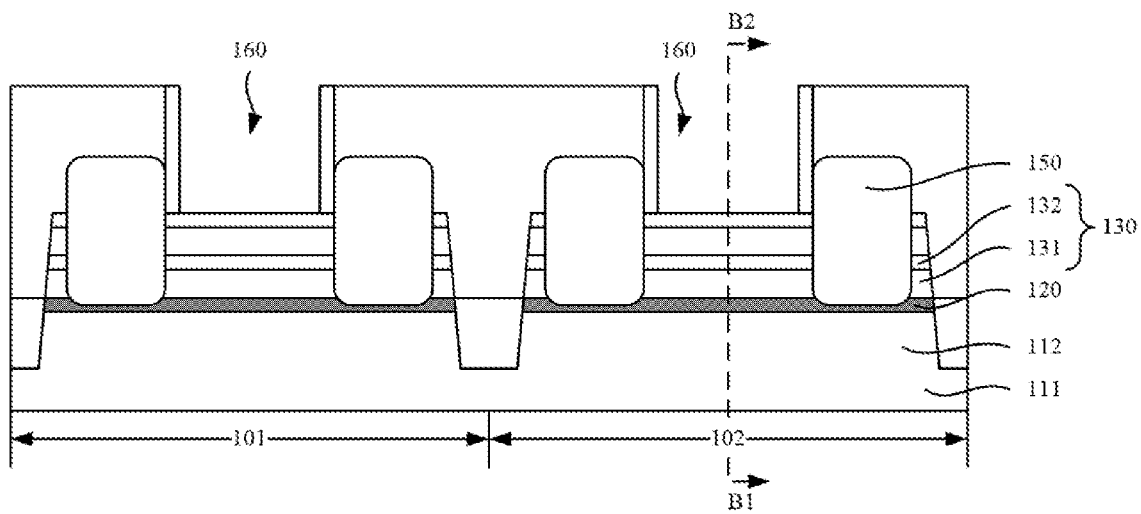
Figure 7:
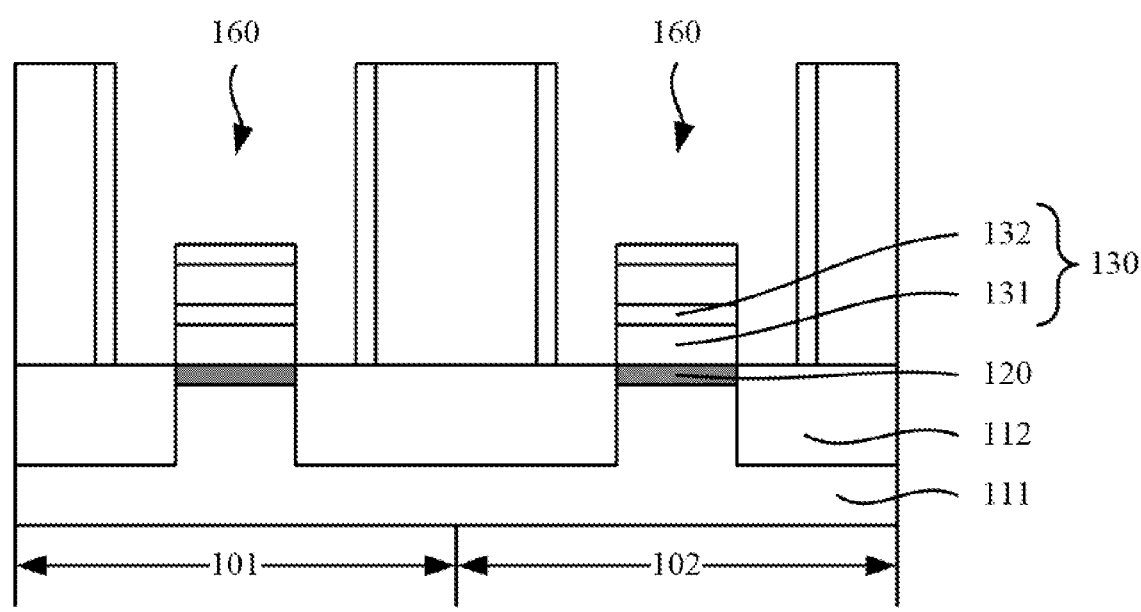

Returning to FIG. 10, after forming the dummy gate structure, gate openings may be formed (S106). FIGS. 6-7 illustrate a corresponding semiconductor structure. FIG. 7 is a B1B2-sectional view of the semiconductor structure in FIG. 6.

As shown in FIGS. 6-7, the dummy gate structure 140 (referring to FIG. 5) is removed; and an gate opening 160 is formed in the PMOS region 101 and an gate opening 160 is formed in the second region 102. Removing the dummy gate structure 140 may provide a process base for subsequently forming an all-around gate structure.

In one embodiment, the dummy gate structure 140 may be across the stacked channel layer 130; and cover portions of the top surface and the sidewall surfaces of the stacked channel layer 130. Thus, the gate opening 160 may at least expose the portion of the top surface and portions of the sidewall surfaces of the stacked channel layer 130. As shown in FIG. 7, the stacked channel layer 120 may protrude from the gate opening 160; and may expose the sidewall surfaces of the sacrificial layer 131.

In some embodiments, according to the different heights of the isolation structure, the dummy gate may cover portions of the sidewall surfaces of the isolation layer, or cover portions of the sidewall surfaces of the fin. Thus, the gate opening may expose portions of the sidewall surfaces of the isolation layer, or portions of the sidewall surfaces of the fin.

The details for removing the dummy gate structure may be referred to the existing technologies.

In one embodiment, the interlayer dielectric layer may be formed on the semiconductor substrate 111 between adjacent dummy gate structures 140. Thus, the gate opening 140 may be located in the interlayer dielectric layer. Further, the sidewall spacers may be formed on the sidewall surfaces of the dummy gate structure 140. Thus, the sidewall surfaces of the gate opening 160 may expose the sidewall spacers.

Returning to FIG. 10, after forming the gate opening, the sacrificial layer may be removed (S107). FIG. 8 illustrates a corresponding semiconductor structure.

As shown in FIG. 8, the sacrificial layer 131 exposed by the gate opening 160 is removed; and a gap 133 connecting with the gate opening 160 may be formed. Accordingly, the stacked channel layer 132 may be suspended; and it may enable the subsequently formed all-around gate structure to surround the channel layer 132.

Because the sacrificial layer 131 may be removed after forming the stress layer 150 (referring to FIG. 6), the two ends of the channel layer 132 may connect with the stress layer 150; and may be suspended in the gate opening 160.

In one embodiment, two stacked channel layers 130 may be formed on the fin 112. Thus, during removing the sacrificial layer 131, after the two sacrificial layers 131 in the two stacked channel layers 130 are removed, one gap 133 may be formed under the channel layer 132 of each stacked channel layer 130.

The sacrificial layer 131 exposed by the gate opening 160 may be removed by any appropriate process. In one embodiment, a wet etching process may be used to the sacrificial layer 131 to reduce the damage to the channel layer 132. Accordingly, the yield of the semiconductor structure may be increased; and the performance of the semiconductor structure may be improved. In particular, when removing the sacrificial layer 131 exposed by the gate opening 161, the etching rate of the sacrificial layer 131 may be greater than the etching rate of the channel layer 132.

In one embodiment, the channel layer 132 is made of Si; and the sacrificial layer 131 may be made of SiGe. Thus, a HCl vapor may be used to remove the sacrificial layer 131. The etching rate of the HCl vapor to SiGe may be significantly different from the etching rate of the HCl vapor to the Si. Thus, using the HCl vapor to remove the sacrificial layer 131 may be able to effectively reduce to the possibility for damaging the channel layer 132. Accordingly, the yield of the semiconductor structure may be increased; and the performance of the semiconductor device may be improved.

In one embodiment, the mass percentage HCl of the HCl vapor may be in a range of approximately 20%-90% so as to effectively etch the sacrificial layer 131 and prevent the damage to the channel layer 132.

Returning to FIG. 10, after removing the sacrificial layer, an all-around gate structure may be formed (S108). FIG. 9 illustrates a corresponding semiconductor structure.

As shown in FIG. 9, an all-around gate structure 180 may be formed in the gate opening 160. Referring to FIG. 8, the all-around gate structure 180 may be formed by filling the gate opening 160 and the gap 133. The all-around gate structure 180 may be used to control the on/off of the channel of the semiconductor structure.

Because the gate opening 160 may connect with the gap 133 and the all-around gate structure 180 may fill the gate opening 160, the all-around gate structure 180 may fill the gap 133. Thus, the all-around gate structure 180 may surround the channel layer 132 from all around the channel layer 132 exposed by the gate opening 160 and the gap 133. That is, the all-around gate structure 180 may cover the top surface, the bottom surface and the sidewall surfaces of the channel layer 132.

In one embodiment, the number of the stacked channel layers 132 is two; and a gap 133 is formed under each channel layer 132. Thus, the all-around gate structure 180 may fill the two gaps 133 under the two channel layers 132. Accordingly, the all-around gate structure 180 may surround all the two channel layers 132.

Because the gate opening 160 may connect with the gap 133, the gap 133 between the channel layer 132 and the isolation layer 120 may also be filled by the all-around gate structure 180. Thus, the all-around gate structure 180 may also be formed on the isolation layer 120. The bandgap of the material of the isolation layer 120 may be greater than the bandgap of the material of the fin 112. Thus, the voltage for forming a parasitic channel in the isolation layer 120 may be substantially high. Thus, the formation of the parasitic channel may be suppressed; and the leakage current in the semiconductor structure may be reduced; and the performance of the semiconductor structure may be improved.

In one embodiment, the all-around gate structure 180 may be a metal gate structure. Thus, the all-around gate structure 180 may include a gate dielectric layer (not labeled) and a gate electrode (not labeled).

The process for forming the all-around gate structure 180 may include forming a gate dielectric layer in the gate opening 160 (referring to FIG. 8). The gate dielectric layer may cover the sidewall surfaces and the bottom surfaces of the gate opening 160; and may also cover the surface of the channel layer 132 suspended in the gate opening 160. Then, as shown in FIG. 9, after forming the gate dielectric layer, a metal material may fill in the gate opening 160 to form the gate electrode.

The gate dielectric layer may electrically isolate the gate electrode from the channel of the semiconductor structure. Because the channel of the semiconductor structure may be disposed in the channel layer 132, the gate dielectric layer may cover all the surfaces of the channel layer 132 in the gate opening 160. In particular, the gate dielectric layer may cover the top surface, the bottom surface and the sidewall surfaces of the channel layer 132 in the gate opening 160. In one embodiment, the bottom of the gap 133 connecting with the gate opening 160 may expose the isolation layer 120. Thus, the gate dielectric layer may also cover the surface of the isolation layer 120.

The gate dielectric layer may be made of a high dielectric constant (high-K) dielectric material. The high-K dielectric material is the material having a relative dielectric constant greater than the dielectric constant of silicon. In one embodiment, the gate dielectric layer is made of $HfO_2$. In some embodiments, the gate dielectric layer may be made of $ZrO_2$, HfSiO, HfSiON, HfTaO, HfSiO, HfZrO, or $Al_2O_3$, etc.

Various processes may be used to form the gate dielectric layer. In one embodiment, the gate dielectric layer is formed by an ALD process. In some embodiments, the gate dielectric layer may be formed by a film deposition process, such as a CVD process, or a PVD process, etc.

The gate electrode may be used as an electrode to form an electrical connection with an external circuit. In one embodiment, the gate electrode is made of W. In some embodiments, the gate electrode may be made of Al, Cu, Ag, Au, Pt, Ni, or Ti, etc.

The present disclosure also provides a semiconductor structure. FIG. 9 illustrates an exemplary semiconductor structure consistent with various disclosed embodiments.

As shown in FIG. 9, the semiconductor structure may include a semiconductor substrate 111, a plurality of fins 112 protruding from the semiconductor substrate 111, and an isolation layer 120 formed on the fins 112. The bandgap of the material of the isolation layer 120 may be greater than the bandgap of the material of the fins 112. The semiconductor structure may also include a channel layer 132 on the isolation layer 120 and alternately disposed with the isolation layer 120. Further, in one embodiment, the semiconductor structure may include an all-around gate structure 180 on the isolation layer 120 and surrounding the channel layer 132. The detailed structures and intermediate structures are described above with respect to the fabrication processes.

The semiconductor substrate 111 may provide a process platform for subsequent processes.

In one embodiment, the semiconductor structure is a CMOS device, the semiconductor substrate 111 may include a PMOS region 101 for forming a PMOS device and an NMOS region 102 for forming an NMOS device. In some embodiments, the semiconductor structure may be only a PMOS device or an NMOS device. Accordingly, the semiconductor substrate may only include a PMOS region or an NMOS region.

In one embodiment, the semiconductor substrate 111 in the PMOS region 101 is adjacent to the semiconductor substrate 111 in the NMOS region 102. In some embodiments, the semiconductor substrate in the PMOS region and the semiconductor substrate in the NMOS region may be isolated by other structure(s).

In one embodiment, the semiconductor substrate 111 is made of single crystal silicon. In some embodiments, the semiconductor substrate may be made of polysilicon, amorphous silicon, amorphous germanium, germanium, silicon germanium, silicon carbide, gallium arsenide, or gallium indium, etc. In some other embodiments, the semiconductor substrate may be a silicon on insulator (SOI) substrate, a germanium on insulator (GOI) substrate, or a glass substrate, etc. The material of the semiconductor substrate may be a material that meets the process requirements and is easy to be integrated.

In one embodiment, the fins 112 and the semiconductor substrate 111 are made of a same material, e.g., single crystal silicon. In some embodiments, the fins and the semiconductor substrate may be made of different materials. The fins 112 may be made of other appropriate semiconductor material, such as silicon, germanium, silicon germanium, or silicon carbide, etc.

In one embodiment, the fins 112 and the semiconductor substrate 111 may be an integrated structure. That is, the semiconductor substrate 111 and the fins 112 may be different portions of a base substrate.

The isolation layer 120 may be used to isolate the fins 112 from the all-around gate structure 180; and to increase the distance between the fins 112 and the all-around gate structure 180 so as to reduce the possibility for forming a parasitic channel in the fins 112 under the control of the all-around gate structure 180. Accordingly, the leakage current of the semiconductor structure may be suppressed.

Because the band gap of the material of the isolation layer 120 may be greater than the bandgap of the material of the fins 112, that is, the energy difference between the Fermi level of the material of the isolation layer 120 and the bottom of the conduction band is greater than the energy difference between the Fermi level of the material of the fins 120 and the bottom of the conduction band, the turn-on voltage of the channel in the isolation layer 120 may be substantially large. Thus, the possibility for forming a parasitic channel under the all-around gate structure 180 may be effectively reduced. Thus, the leakage current of the semiconductor structure may be effectively reduced; and the performance of the semiconductor structure may be improved.

In one embodiment, the fins 112 are made of Si, the bandgap of the material of the isolation layer 120 may be greater than the bandgap of Si. In particular, the bandgap of Si is approximately 1.12 eV, the bandgap of the material of the isolation layer 120 may be greater than 1.12 eV.

In one embodiment, the isolation layer 120 may be made of at least one of GaN and AlGaN. GaN and AlGaN are the third generation semiconductor which have a substantially large bandgaps; and the turn-on voltage of the internal channel of the GaN and AlGaN may be substantially high. Thus, an isolation between the fins 112 and the all-around gate structure 180 may be able to achieve. Accordingly, the formation of the parasitic channel may be suppressed, and the leakage current of the semiconductor structure may be effectively reduced.

The thickness of the isolation layer 120 may be in an appropriate range. In one embodiment, the thickness of the isolation layer 120 may also be in a range of approximately 20 Å-400 Å. If the thickness of the isolation layer 120 is too small, the isolation layer 120 may be unable to effectively isolate the fins 112 from the all-around gate structure 180. The distance between the fins 112 and the all-around gate structure 180 may be substantially small, which may not facilitate to suppress the parasitic channel in the isolation layer 120 and may not facilitate to reduce the leakage current. If the thickness of the isolation layer 120 is substantially large, a material waste may occur; and the process difficulties may be increased.

The channel of the semiconductor structure may be in the channel layer 132. In one embodiment, two channel layers 132 may be formed on the isolation layer 120. A gap 133 may be formed under each channel layer 132; and the gaps 133 may be filled with the all-around gate structure 180.

In one embodiment, the channel layer 132 is made of Si. The thickness of the channel layer 132 may be any appropriate value. In one embodiment, the thickness of the channel layer 132 may be in a range of approximately 40 Å-200 Å. If the thickness of the channel layer 132 is too small, the channel width of the semiconductor structure may be substantially small, which may cause certain electrical issues. For example, the on-resistance of the semiconductor structure may be substantially large. If the thickness of the channel layer 132 is too large, material may be wasted; and the fabrication difficulty may be increased.

The all-around gate structure 180 may be the gate structure of the semiconductor structure; and may be used to control the on/off of the channel of the semiconductor structure.

The all-around gate structure 180 may fill the gap 133 under channel layer 132. Thus, the all-around gate structure 180 may surround the channel layer 132 from all around the channel layer 132. That is, the all-around gate structure 180 may cover the top surface, the bottom surface and the sidewall surfaces of the channel layer 132.

In one embodiment, the number of the stacked channel layers 132 is two; and a gap 133 is formed under each channel layer 132. Thus, the all-around gate structure 180 may fill the two gaps 133 under the two channel layers 132. Accordingly, the all-around gate structure 180 may surround the two channel layers 132.

The all-around gate structure 180 may be formed on the isolation layer 120; and may fill the gap 122 between the channel layer 132 and the isolation layer 120. Because the bandgap of the material of the isolation layer 120 may be greater than the bandgap of the material of the fins 112, the voltage for forming a parasitic channel in the isolation layer 120 may be substantially high. Thus, the formation of the parasitic channel may be effectively suppressed; and the leakage current of the semiconductor structure may be reduced; and the performance of the semiconductor structure may be improved.

In one embodiment, the all-around gate structure 180 may be a metal gate structure. Thus, the all-around gate structure 180 may include a gate dielectric layer (not labeled) and a gate electrode (not labeled).

The gate dielectric layer may electrically isolate the gate electrode from the channel of the semiconductor structure. Because the channel of the semiconductor structure may be disposed in the channel layer 132, the gate dielectric layer may be cover all the surfaces of the channel layer 132. In particular, the gate dielectric layer may cover the top surface, the bottom surface and the sidewall surfaces of the channel layer 132 in the gate opening 160. In one embodiment, the gate dielectric layer may also cover the surface of the isolation layer 120.

The gate dielectric layer may be made of a high dielectric constant (high-K) dielectric material. The high-K dielectric material is the material having a relative dielectric constant greater than the dielectric constant of silicon. In one embodiment, the gate dielectric layer is made of $HfO_2$. In some embodiments, the gate dielectric layer may be made of $ZrO_2$, HfSiO, HfSiON, HfTaO, HfSiO, HfZrO, or $Al_2O_3$, etc.

The gate electrode may be used as an electrode to form an electrical connection with an external circuit. In one embodiment, the gate electrode is made of W. In some embodiments, the gate electrode may be made of Al, Cu, Ag, Au, Pt, Ni, or Ti, etc.

In the disclosed embodiments, the bandgap of the isolation material layer may be greater than the bandgap of the material of the fins. In particular, the bandgap of the material for forming the isolation layer may be greater than the bandgap of the material for forming the fins. Thus, the energy difference between the Fermi level of the isolation material and the bottom of the conduction band may be greater than the energy difference between the Fermi level of the material of the fins and the bottom of the conductive band. Accordingly, the turn-on voltage for forming a channel in the isolation layer may be substantially high. Thus, the formation of the parasitic channel in the isolation layer under the all-around gate structure may be effectively suppressed; and the leakage current in the semiconductor structure may be effectively reduced; and the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
    a semiconductor substrate;
    a plurality of fins protruding from the semiconductor substrate, a first fin of the plurality of fins being formed on a PMOS region, and a second fin of the plurality of fins being formed on an NMOS region, the second fin being adjacent to the first fin;
    an isolation layer formed on the first fin and the second fin and with a bandgap greater than a bandgap of the fins, the isolation layer being made of a material including at least one of GaN or AlGaN;
    a first channel layer formed over each of the first fin and the second fin, the first channel layer being isolated from the isolation layer;
    a dummy gate structure formed across the first fin and the second fin and cover the top surfaces and sidewall surfaces of the first channel layer;
    a first gate opening and a second gate opening formed in the dummy gate structure on the PMOS region and the NMOS region, respectively, a portion of the dummy gate structure being located between the first gate opening and the second gate opening;
    a gate dielectric layer covering bottom surfaces and sidewall surfaces of the first gate opening and the second gate opening, and to cover top surfaces, bottom surfaces, and sidewall surfaces of the first channel layer in the first gate opening and the second gate opening, a gap being located between the gate dielectric layer under the first channel layer and the gate dielectric layer on the bottom surface of each of the first gate opening and the second gate opening; and
    an all-around gate structure formed in each of the first gate opening and the second gate opening to fill the gap, wherein the all-around gate structure covers the gate dielectric layer on the top surfaces, the bottom surfaces, and the sidewall surfaces of the first channel layer in the first and second gate openings.

2. The semiconductor structure according to claim 1, wherein:
    the fins are made of
    Si.

3. The semiconductor structure according to claim 1, wherein:
    a thickness of the isolation layer is in a range of approximately 20 Å-400 Å.

4. The semiconductor structure according to claim 1, wherein:
    the bandgap of the isolation layer is greater than a bandgap of the first channel layer.

5. The semiconductor structure according to claim 1, wherein:
    the first channel layer is made of Si.

6. The semiconductor structure according to claim 1, further comprising:
    a second channel layer on top of the first channel player, wherein the second channel layer is isolated from the first channel layer by a portion of the all-around gate structure.

7. The semiconductor structure according to claim 1, further including:
    a stress layer formed in the first channel layer on the semiconductor substrate.

8. The semiconductor structure according to claim 7, wherein:
    the stress layer has a bottom surface in direct contact with the isolation layer.

9. The semiconductor structure according to claim 1, further comprising:
    a sacrificial layer formed between the first channel layer and the isolation layer.

* * * * *